United States Patent [19]
Webb

[11] Patent Number: 5,963,782
[45] Date of Patent: Oct. 5, 1999

[54] SEMICONDUCTOR COMPONENT AND METHOD OF MANUFACTURE

[75] Inventor: Brian A. Webb, Chandler, Ariz.

[73] Assignee: Motorola, Inc., Schaumburg, Ill.

[21] Appl. No.: 08/904,989

[22] Filed: Aug. 1, 1997

[51] Int. Cl.[6] .......................... H01L 21/44; H01L 21/48; H01L 21/50; H01L 21/66; G01R 31/26
[52] U.S. Cl. ........................... 438/15; 438/112; 438/118; 438/127; 257/676
[58] Field of Search .................................. 438/112, 118, 438/127, 15; 257/676

[56] References Cited

U.S. PATENT DOCUMENTS

| | | |
|---|---|---|
| 4,699,682 | 10/1987 | Takishima . |
| 4,942,454 | 7/1990 | Mori et al. . |
| 5,570,454 | 10/1996 | Liu ........................................ 395/2.32 |

FOREIGN PATENT DOCUMENTS

| | | | |
|---|---|---|---|
| 0709958 | 5/1996 | European Pat. Off. ....... | H03H 21/00 |
| 0782261 | 7/1997 | European Pat. Off. ....... | H03H 21/00 |
| 9639632 | 12/1996 | WIPO . | |

OTHER PUBLICATIONS

Machine Design, "Chemical Sensing Carves Out a Niche", vol. 69, No. 11, Jun. 5, 1997, p. 52.

*Primary Examiner*—John F. Niebling
*Assistant Examiner*—Josetta Jones
*Attorney, Agent, or Firm*—George C. Chen

[57] ABSTRACT

A semiconductor component can be manufactured by providing a leadframe (12) with leads (13) and a flag (14) substantially coplanar with at least one of the leads (13) wherein the flag (14) has a hole (15). An electronic substrate (11) is adhered to the flag (14) wherein a perimeter of the electronic substrate (11) has bonding pads (21), wherein the bonding pads (21) face toward the flag (14), wherein the electronic substrate (11) covers the hole (15), and wherein the flag (14) is absent over the bonding pads (21). Next, the pads (21) are wire bonded to the leads (13), and then the electronic substrate (11) and the leadframe (12) are encapsulated with a packaging material (17) wherein the packaging material (17) has an opening (23) and is devoid of covering the hole (15) in the flag (14).

17 Claims, 1 Drawing Sheet

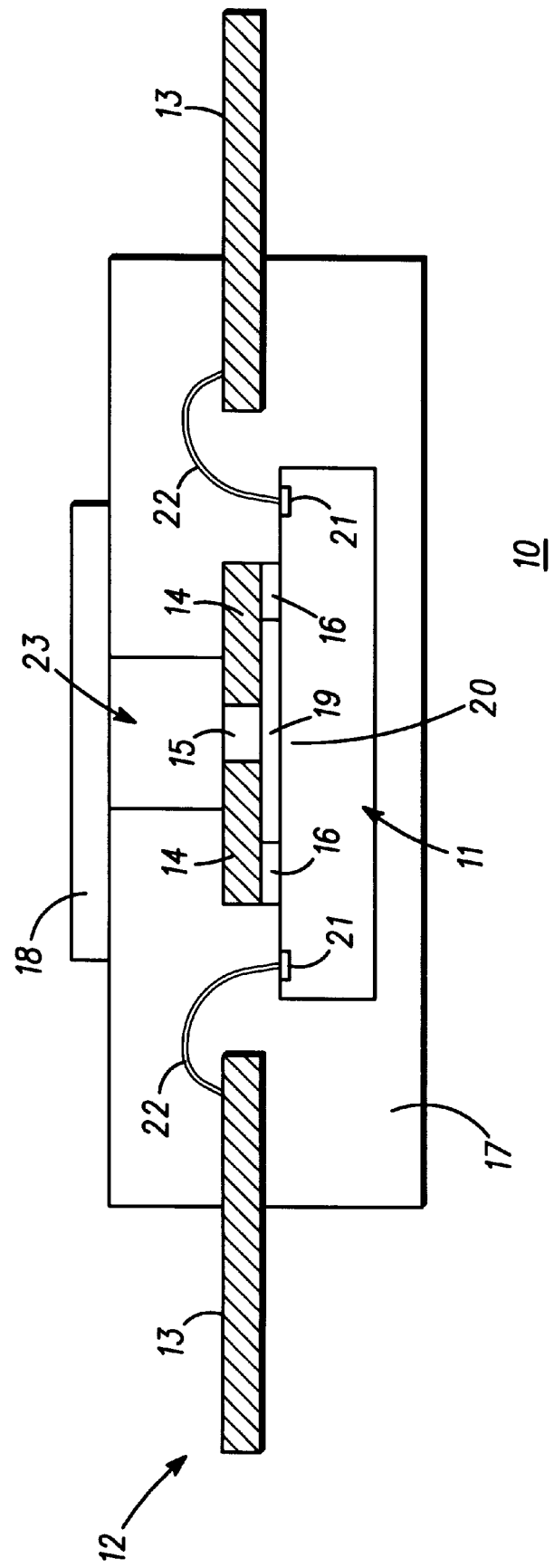

SEMICONDUCTOR COMPONENT AND METHOD OF MANUFACTURE

BACKGROUND OF THE INVENTION

This invention relates, in general, to semiconductor components, and more particularly, to packaged semiconductor components.

Micromachined devices such as, for example, accelerometers, pressure sensors, chemical sensors, and temperature sensors cannot be molded in low cost plastic packages without first providing a protective cover over the micromachined mechanism. However, the protective cover increases the complexity and cost of manufacturing the micromachined devices. Furthermore, pressure sensors, chemical sensors, and temperature sensors cannot be fully sealed in conventional low cost plastic packages because the sensors must be at least partially exposed to the ambient in order to detect a change in pressure, chemistry, or temperature.

Accordingly, a need exists for providing a low cost and easily manufactured package for semiconductor components such as micromachined devices.

BRIEF DESCRIPTION OF THE DRAWING

The single FIGURE illustrates a cross-sectional view of an embodiment of an semiconductor component in accordance with the present invention.

DETAILED DESCRIPTION OF THE DRAWING

The single FIGURE illustrates a cross-sectional view of an electronic or semiconductor component 10 that includes an electronic chip or substrate 11 and a leadframe 12. An electronic device 20 is formed in substrate 11, which is comprised of a semiconductor when device 20 is a semiconductor device. In the preferred embodiment, device 20 is micromachined sensor such as, for example, a pressure sensor, a chemical sensor, or a temperature sensor. A plurality of exposed metal regions or bonding pads 21 are located at a periphery of substrate 11. Pads 21 are adjacent to and electrically coupled to device 20. Other details of substrate 11 and device 20 are not illustrated in the single FIGURE to facilitate the explanation of component 10.

Leadframe 12 can be any substrate used to support substrate 11. Leadframe 12 is preferably comprised of a thin copper alloy, but can alternatively be comprised of a thicker ceramic substrate with copper tracings or the like. Leadframe 12 includes leads 13 and a mounting portion, support portion, physical coupling portion, or flag 14 adjacent to leads 13. In one embodiment, flag 14 and at least one of leads 13 are substantially coplanar to within approximately 5 degrees. However, in the preferred embodiment, flag 14 is substantially coplanar with all of leads 13. A central portion of flag 14 contains an opening or hole 15, which is preferably entirely defined by flag 14.

Substrate 11 is disposed over and physically coupled to flag 14 of leadframe 12. Substrate 11 is positioned such that pads 21 face in a direction towards flag 14. Located within the periphery of substrate 11, a central portion of substrate 11 is preferably located or aligned over hole 15 of flag 14. A footprint of substrate 11 is preferably larger than a footprint of flag 14 such that flag 14 preferably does not cover the periphery of substrate 11 or pads 21.

An adhesive 16 provides the coupling mechanism between substrate 11 and leadframe 12. Adhesive 16 is preferably a ring around a perimeter or periphery of flag 14. Adhesive 16 does not cover hole 15. As an example, adhesive 16 can be an adhesive tape or a thermoplastic adhesive. In the preferred embodiment, adhesive is a die-attach tape called "SumiOxy" and distributed by Occidental Chemical Corporation of Grand Island, N.Y.

Adhesive 16 preferably also serves as a stand-off between flag 14 and substrate 11. In this preferred embodiment, a space, gap, or cavity 19 is created between flag 14 and a central portion of substrate 11. When device 20 is a micromachined sensor, the micromachined portion of device 20 (i.e., the thin semiconductor membrane or diaphragm of a pressure or chemical sensor, etc.) is protected within cavity 19. Therefore, the height of cavity 19 must be large enough to permit proper movement of a diaphragm of device 20 when device 20 is, for example, a pressure sensor. In the preferred embodiment, cavity 19 has a depth and adhesive 16 has a height of approximately twenty-five to seventy-five micrometers. Accordingly, component 10 does not require a separate cover or cap to protect the micromachined portion of device 20. Therefore, component 10 can be manufactured in fewer steps, which results in a faster and cheaper manufacturing process.

A subsequent step in manufacturing or fabricating component 10 includes electrically coupling pads 21 to leads 13 of leadframe 12. In the preferred embodiment, a plurality of wire bonds 22 provide the electrical coupling. However, tape-automated-bonding (TAB), flip-chip bonding techniques, or the like could also be used to provide the electrical coupling. If flip-chip bonding were used, then the step of mounting substrate 11 over leadframe 12 would inherently include the electrical coupling step. Furthermore, if flip-chip bonding were used, bonding pads 21 would be electrically coupled to the opposite surface of leads 13.

After the electrical coupling step, an encapsulant or packaging material 17 is provided or disposed around substrate 11 and leadframe 12. Material 17 is used to protect device 20 and wire bonds 22 from moisture, corrosion, contamination, physical impact, or the like. Material 17 can be a plastic cover or metal lid, especially when leadframe 12 comprises a ceramic substrate, but material 17 is preferably a high pressure, transfer molding compound or the like. In the preferred embodiment, the coplanarity of flag 14 and leads 13 is also maintained during the packaging step.

Material 17 is formed to have a hole or opening 23 such that material 17 does not cover hole 15 in flag 14. Therefore, hole 15 remains exposed after the packaging step. Opening 23 and hole 15 permit device 20 to sense the ambient for temperature, chemicals, pressure, or the like.

An optional cap or cover 18 can subsequently be disposed over hole 15 and adhered to material 17. As an example, cover 18 can be comprised of a filter when device 20 is a chemical sensor. As another example, cover 18 can be comprised of a port when device 20 is a pressure or temperature sensor. As an alternative to this example, cover 18 can be adhered to a surface of flag 14 opposite substrate 11 before the packaging step or even before adhering substrate 11 to leadframe 12. In these alternative embodiments, material 17 still has opening 23 to expose device 20 to the ambient.

Although not depicted in the single FIGURE, leads 13 of component 10 are subsequently bent in a typical configuration. Preferably, leads 13 are bent away from cover 18 so that when component 10 is mounted on a circuit board, device 20, hole 15, and opening 23 face toward the open ambient instead of facing towards the circuit board. In this manner, leads 13 can be bent and formed close to packaging material 17 such that component 10 is a surface mount device.

Many alternative embodiments exist for component 10. In one alternative embodiment, if flag 14 were large enough, a second electronic substrate (not shown) could be mounted on flag 14 and encapsulated within packaging material 17. In this alternative embodiment, the second electronic substrate may be mounted on the same or opposite surface of flag 14 on which substrate 11 is mounted. If the second electronic substrate is mounted on the opposite surface of flag 14, then the second component should not cover hole 15 in flag 14 for reasons explained hereinbefore. In this example, the second electronic substrate can include an integrated circuit electrically coupled to device 20 and can be used to provide increased functionality and accuracy for sensor or device 20. In this embodiment, bonding pads of the second electronic substrate can face away from substrate 11 if wire bonds are used to electrically couple the integrated circuit to device 20. Alternatively, the bonding pads of the second electronic substrate can face towards substrate 11 if the second electronic substrate is a flip-chip substrate.

As another alternative embodiment, a second electronic substrate (not shown) could be mounted over a second flag (not shown) of leadframe 12. Yet another undepicted alternative embodiment includes using a flagless leadframe for supporting a plurality of electronic substrates. Furthermore, various combinations of the previously described alternative embodiments can be used if a third, fourth, or other additional electronic substrates are packaged together with substrate 11 in component 10.

Therefore, an improved packaged semiconductor component is provided and overcomes the disadvantages of the prior art. The manufacturing process of the semiconductor component is low cost and is not complex because it avoids the need for a separate capping chip to protect the micromachined portions of the semiconductor component.

I claim:

1. A method of manufacturing a semiconductor component comprising:
   providing a leadframe having a flag with a hole;
   disposing an electronic chip over the flag wherein the electronic chip covers the hole; and
   disposing a packaging material around the electronic chip and the leadframe wherein the hole in the flag remains exposed after the disposing step.

2. The method of claim 1 wherein the step of providing includes providing the leadframe with a lead coplanar with the flag and wherein the step of disposing the packaging material includes maintaining the coplanarity.

3. The method of claim 1 wherein the step of disposing the electronic chip comprises:
   providing the electronic chip with a footprint larger than a footprint of the flag;
   providing the electronic chip with an exposed metal region;
   facing the exposed metal region in a direction toward the flag; and
   keeping the exposed metal region from being covered by the flag.

4. A method of manufacturing a semiconductor component comprising:
   providing a leadframe having a flag with a hole; and
   disposing an electronic chip over the flag wherein the electronic chip covers the hole,
   wherein the step of disposing the electronic chip includes providing the electronic chip with a bonding pad at a periphery of the electronic chip wherein the flag is devoid of covering the bonding pad.

5. The method of claim 4 wherein the step of providing the leadframe includes providing the leadframe with a lead and further comprising wire bonding the bonding pad to the lead after disposing the electronic chip.

6. The method of claim 1 wherein the step of disposing the electronic chip includes using an adhesive to physically couple the electronic chip and the flag wherein the adhesive is a stand-off between the leadframe and the electronic chip.

7. A method of manufacturing a semiconductor component comprising:
   providing a leadframe having a flag with a hole;
   disposing an electronic chip over the flag wherein the electronic chip covers the hole; and
   disposing a filter over the hole in the flag.

8. A method of manufacturing a semiconductor component comprising:
   providing a leadframe having a flag with a hole;
   disposing an electronic chip over the flat wherein the electronic chip covers the hole; and
   disposing a port over the hole in the flag.

9. A method of fabricating an electronic component comprising:
   providing a support substrate with an electrical coupling portion adjacent to a physical coupling portion having a hole;
   providing an electronic substrate having an electronic device; and
   physically coupling the electronic substrate to the physical coupling portion wherein the electronic substrate is located over the hole and wherein the electronic device is electrically coupled to the electrical coupling portion,
   wherein the step of physically coupling further comprises:
      aligning a central portion of the electronic substrate over the hole in the physical coupling portion of the support substrate; and
      using an adhesive to couple the electronic substrate to a perimeter of the physical coupling portion of the support substrate wherein the adhesive provides a gap between the central portion of the electronic substrate and a central portion of the physical coupling portion.

10. A method of fabricating an electronic component comprising:
    providing a support substrate with an electrical coupling portion adjacent to a physical coupling portion having a hole;
    providing an electronic substrate having an electronic device;
    physically coupling the electronic substrate to the physical coupling portion wherein the electronic substrate is located over the hole and wherein the electronic device is electrically coupled to the electrical coupling portion; and
    packaging the electronic substrate and the support substrate with an encapsulant wherein the encapsulant is devoid of completely covering the hole in the support substrate.

11. The method of claim 9 wherein the step of providing the electronic substrate includes providing the electronic substrate with a plurality of exposed metal regions and further comprising keeping the physical coupling portion from covering the plurality of exposed metal regions wherein the step of keeping occurs after the step of physically coupling.

12. A method of fabricating an electronic component comprising:

providing a support substrate with an electrical coupling portion adjacent to a physical coupling portion having a hole;

providing an electronic substrate having an electronic device;

physically coupling the electronic substrate to the physical coupling portion wherein the electronic substrate is located over the hole and wherein the electronic device is electrically coupled to the electrical coupling portion; and disposing a cover over the hole in the physical coupling portion.

13. A method of manufacturing an electronic component comprising:

providing a leadframe having a flag and leads coplanar with the flag wherein the flag has a hole;

adhering an electronic substrate to the flag wherein a surface of the electronic substrate has bonding pads, wherein the bonding pads face toward the flag, wherein the electronic substrate covers the hole, and wherein the flag is absent over the bonding pads;

wire bonding the bonding pads to the leads; and encapsulating the electronic substrate and the leadframe with a molding compound wherein the molding compound is devoid of covering the hole in the flag.

14. The method of claim 13 wherein the step of adhering includes providing the bonding pads adjacent to a periphery of the electronic substrate.

15. The method of claim 13 wherein the step of adhering includes providing a gap between the electronic substrate and the flag.

16. The method of claim 7 wherein the step of disposing the electronic chip includes providing a chemical sensor for the electronic chip.

17. The method of claim 8 wherein the step of disposing the electronic chip includes providing a pressure sensor for the electronic chip.

* * * * *

UNITED STATES PATENT AND TRADEMARK OFFICE
CERTIFICATE OF CORRECTION

PATENT NO.    : 5,963,782
DATED         : October 5, 1999
INVENTOR(S)   : Brian A. Webb Page 1 of 1

It is certified that error appears in the above-identified patent and that said Letters Patent is hereby corrected as shown below:

<u>Column 4,</u>
Line 18, delete "flat" and add -- flag --.

Signed and Sealed this

Seventh Day of May, 2002

*Attest:*

JAMES E. ROGAN
*Attesting Officer*    *Director of the United States Patent and Trademark Office*